US008385111B2

(12) United States Patent
Kim

(10) Patent No.: US 8,385,111 B2
(45) Date of Patent: Feb. 26, 2013

(54) SEMICONDUCTOR MEMORY APPARATUS

(75) Inventor: Dong Keun Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 265 days.

(21) Appl. No.: 12/844,712

(22) Filed: Jul. 27, 2010

(65) Prior Publication Data
US 2011/0205789 A1 Aug. 25, 2011

(30) Foreign Application Priority Data
Feb. 24, 2010 (KR) .................. 10-2010-0016745

(51) Int. Cl.
G11C 11/00 (2006.01)
(52) U.S. Cl. .................. 365/163; 365/230.03
(58) Field of Classification Search .................. 365/163, 365/230.03
See application file for complete search history.

(56) References Cited

U.S. PATENT DOCUMENTS

| 7,012,834 | B2 | 3/2006 | Cho et al. |
| 7,149,103 | B2 | 12/2006 | Ahn |
| 7,304,886 | B2 | 12/2007 | Cho et al. |
| 7,447,092 | B2 | 11/2008 | Cho et al. |
| 7,502,251 | B2 | 3/2009 | Choi et al. |
| 7,558,102 | B2* | 7/2009 | Shore ............................. 365/149 |
| 2001/0055233 | A1* | 12/2001 | Nagai ....................... 365/225.7 |
| 2007/0153613 | A1* | 7/2007 | Shinozaki et al. ............. 365/226 |
| 2008/0006885 | A1* | 1/2008 | Arai et al. ...................... 257/390 |
| 2008/0037355 | A1* | 2/2008 | Hirabayashi ............. 365/230.03 |
| 2008/0062753 | A1 | 3/2008 | Cho et al. |
| 2008/0291766 | A1* | 11/2008 | Bessho et al. ............ 365/230.03 |
| 2009/0059658 | A1 | 3/2009 | Cho et al. |
| 2010/0124138 | A1* | 5/2010 | Lee et al. ....................... 365/222 |

FOREIGN PATENT DOCUMENTS

| JP | 2005-222687 | 8/2005 |
| JP | 2007-087568 | 4/2007 |
| JP | 2007-164971 | 6/2007 |
| KR | 1020080025841 A | 3/2008 |
| KR | 1020090117189 A | 11/2009 |

* cited by examiner

Primary Examiner — Michael Tran
(74) Attorney, Agent, or Firm — William Park & Associates Ltd.

(57) ABSTRACT

A semiconductor memory apparatus includes a plurality of unit cell arrays having a plurality of word lines which are disposed in a row direction and a plurality of global bit lines which are disposed in a column direction; a row decoder configured to activate at least two word lines among the plurality of word lines in response to a row address which designates one word line; a global column switch block configured to select two different global bit lines among the plurality of global bit lines in response to column control signals; and a column decoder configured to generate the column control signals in response to a column address.

16 Claims, 9 Drawing Sheets

SEMICONDUCTOR MEMORY APPARATUS

CROSS-REFERENCES TO RELATED APPLICATION

The present application claims priority under 35 U.S.C. §119(a) to Korean application number 10-2010-0016745, filed on Feb. 24, 2010, in the Korean Intellectual Property Office, which is incorporated herein by reference in its entirety as set forth in full.

BACKGROUND

1. Technical Field

The present invention relates generally to a semiconductor memory apparatus, and more particularly to a phase change memory apparatus.

2. Related Art

As shown in FIG. 1, a phase change memory cell (hereinafter also referred to as a "memory cell") used in a conventional phase change memory apparatus utilizes germanium-antimony-tellurium (Ge2Sb2Te5: GST) as a phase change substance such that a combination of a GST and a diode comprising a phase change memory cell is connected between a bit line BL and a word line WL. Although not shown in FIG. 1, the phase change memory cell may be configured as a GST and transistor combination.

The GST can undergo a phase change of an amorphous phase or a crystalline phase through heat applied by an electrical current.

Information then can be recorded in the phase memory cell using the variable resistant characteristic of the GST, that is, the resistance value of the amorphous phase is relatively higher than the resistance value of the crystalline phase.

FIG. 2 shows a conventional X8 type phase change memory apparatus, in which input/output paths (I/O) are designed such that 8-bit data can be inputted/outputted through one time activation of a word line.

Referring to FIG. 2, a conventional phase change memory apparatus 1 includes a plurality of unit cell arrays 'Unit Cell Array', a row decoder 10, a column decoder 20, a write driver/sense amplifier array block 30, a global column switch block 40, a plurality of local row switch blocks 50, and a plurality of local column switch blocks 60.

As a word line WL is activated by the row decoder 10, unit cell arrays 'Unit Cell Array' in the row direction are selected.

Unit cell arrays 'Unit Cell Array' in the column direction are activated by the column decoder 20 and the local column switch blocks 60.

The write driver/sense amplifier array block 30 includes a plurality of write driver/sense amplifier arrays 31.

As eight global bit lines GBL<0:7> are selected by the global column switch block 40, write/read paths between the write driver/sense amplifier array block 30 and activated unit cell arrays 'Unit Cell Array' are defined.

Accordingly, 8-bit data can be written into or read out from the eight selected memory cells of the activated unit cell arrays 'Unit Cell Array' through input/output paths I/O<0:7>.

As shown in FIG. 3, a plurality of global bit lines GBL and a plurality of bit lines BL are disposed in the unit cell arrays 'Unit Cell Array'.

A number of bit lines BL corresponding to a preset coding rate is connected to the global bit line GBL.

The global column switch block 40 includes a plurality of pass gates, four of which are shown in FIG. 3, block 40. One end from each input/output terminal of the respective pass gates is respectively connected to the global bit lines GBL.

The other four ends from the input/output terminals of four pass gates, which define a unit, are commonly connected to the write driver W/D and the sense amplifier S/A of the write driver/sense is amplifier array 31 as shown in FIG. 3.

Data input/output can occur by activating one of the four pass gates in response to column control signals GYSW<0:3> and GYSWB<0:3> provided from the column decoder 20.

In this case, the global bit line GBL connected to the activated pass gate corresponds to the global bit line GBL0 shown in FIG. 2.

As a result, in the X8 type phase change memory apparatus 1, one data is outputted from each of the activated unit cell arrays 'Unit Cell Array'.

Meanwhile, to increase the number of input/output data as in an X16 or X32 type device with same memory capacity as that shown in FIG. 3, the number of data inputted/outputted from the unit cell arrays 'Unit Cell Array' connected to the one activated word line WL should be increased, and the design of input/output paths (I/O) should be changed correspondingly.

For example, a conventional X16 type phase change memory apparatus 2 as shown in FIG. 4 inputs/outputs two sets of data in each of the activated unit cell arrays 'Unit Cell Array' such that a total of 16-bit data is inputted/outputted through the input/output paths I/O<0:15>.

In order to input/output two sets of data in each of activated unit cell arrays 'Unit Cell Array', the circuit configuration of the column decoder 21, the write driver/sense amplifier array block 50, the global column switch block 41, and the local column switch is blocks 61 shown in FIG. 4 would need to be changed to be different from those shown in FIG. 3.

However, as described above, increasing the number of the input/output paths (I/O) means increasing the number of data inputted/outputted through the unit cell arrays 'Unit Cell Array' connected to the one activated word line WL, and this also means that the number of memory cells which are selected by the activated word line WL also increases as shown in FIG. 5.

Consequently, an increase in the amount of current flowing through the activated word line WL means a rise in the voltage level in the word line WL. This will likely degrade the current discharge capability of the diode or transistor connected to the GST. As a result, data recording cannot be precisely implemented and the reliability of cell data is apt to deteriorate due to decreased amount of current flowing through the GST from a bit line BL to a word line WL.

SUMMARY

A phase change memory apparatus capable of stable data recording regardless of increase in input/output paths (I/O) is described herein.

In one embodiment of the present invention, a semiconductor memory apparatus comprises a plurality of unit cell arrays having a plurality of word lines which are disposed in a row direction and a plurality of global bit lines which are disposed in a column direction; a row decoder configured to activate at least two word lines among the plurality of word lines in response to a row address which designates one word line; a global column switch block configured to select two different global bit lines among the plurality of global bit lines in response to column control signals; and a column decoder configured to generate the column control signals in response to a column address.

In another embodiment of the present invention, a semiconductor memory apparatus comprises a plurality of unit cell arrays each having phase change memory cells; a plurality of word lines disposed in a row direction of the plurality of unit cell arrays; odd global bit lines connected with odd-numbered unit cell arrays among the plurality of unit cell arrays in a column direction; even global bit lines connected with even-numbered unit cell arrays among the plurality of unit cell arrays in the column direction; a row decoder configured to activate, in response to a row address designating one word line, the word line corresponding to the row address and a word line corresponding to a next row address; a global column switch block configured to select one of the even global bit lines and one of the odd global bit lines in response to column control signals; and a column decoder configured to generate the column control signals in response to a column address.

In another embodiment of the present invention, a semiconductor memory apparatus comprises a plurality of unit cell arrays each having phase change memory cells; a plurality of word lines disposed in a row direction of the plurality of unit cell arrays; odd global bit lines and even global bit lines respectively disposed to be connected with alternate two unit cell arrays in a column direction among the plurality of unit cell arrays; a row decoder configured to activate, in response to a row address designating a word line, one word line in every two word lines including the word line corresponding to the row address; a global column switch block configured to select one of the odd global bit lines and one of the even global bit lines in response to column control signals; and a column decoder configured to generate the column control signals in response to a column address, wherein the odd global bit lines and the even global bit lines are disposed in such a way as not to be connected with the same unit cell array.

BRIEF DESCRIPTION OF THE DRAWINGS

Features, aspects, and embodiments are described in conjunction with the attached drawings, in which.

DETAILED DESCRIPTION

Hereinafter, a phase change memory apparatus according to preferred embodiments of the present invention will be described below with reference to the accompanying drawings.

Figure 6:
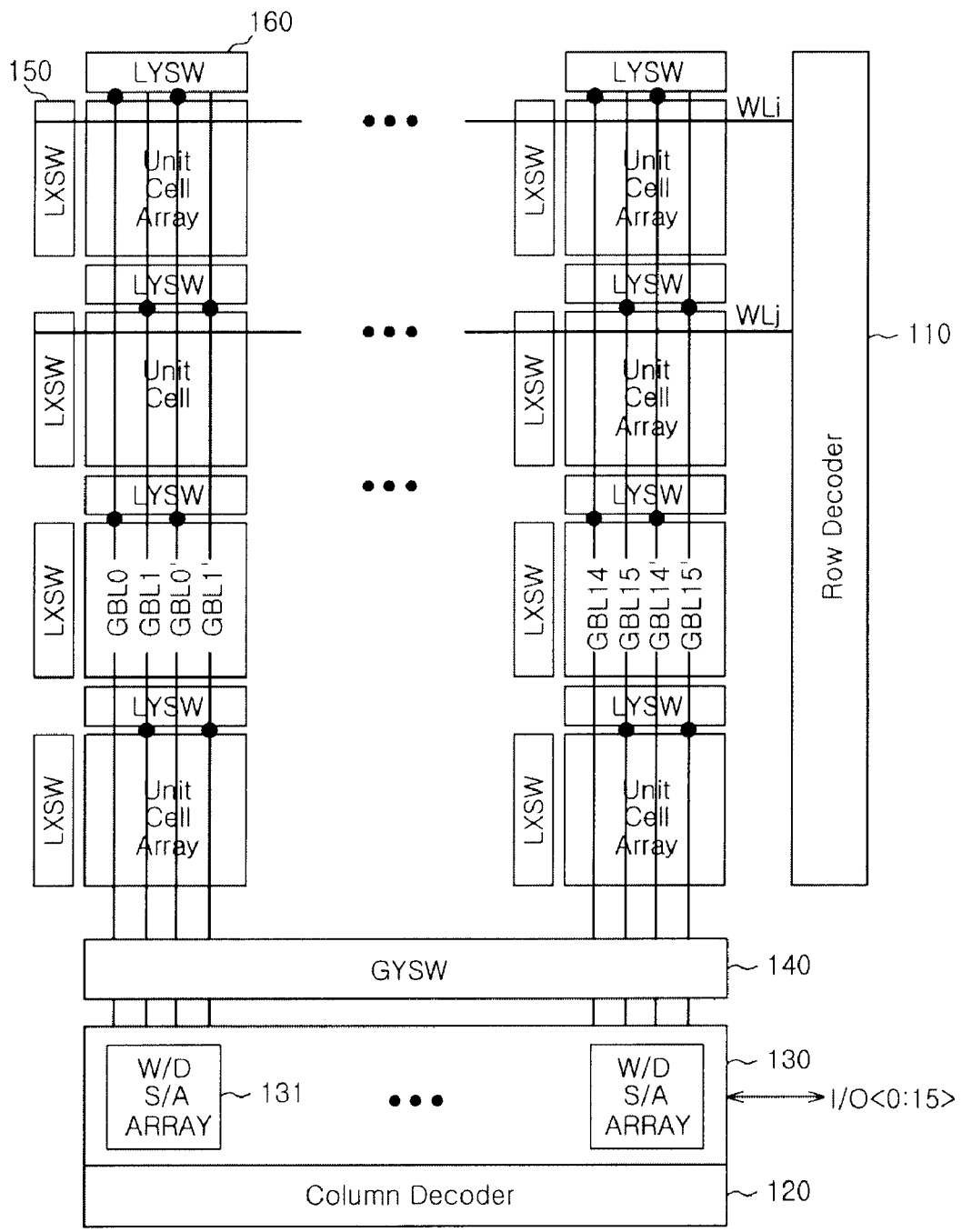
FIG. 6 is a block diagram illustrating a phase change memory apparatus in accordance with an embodiment of the present invention.

Referring to FIG. 6, a phase change memory apparatus 100 in accordance with an embodiment of the present invention includes a plurality of unit cell arrays 'Unit Cell Array', a row decoder 110, a column decoder 120, a write driver/sense amplifier array block 130, a global column switch block 140, a plurality of local row switch blocks 150, and a plurality of local column switch blocks 160.

Figure 1:
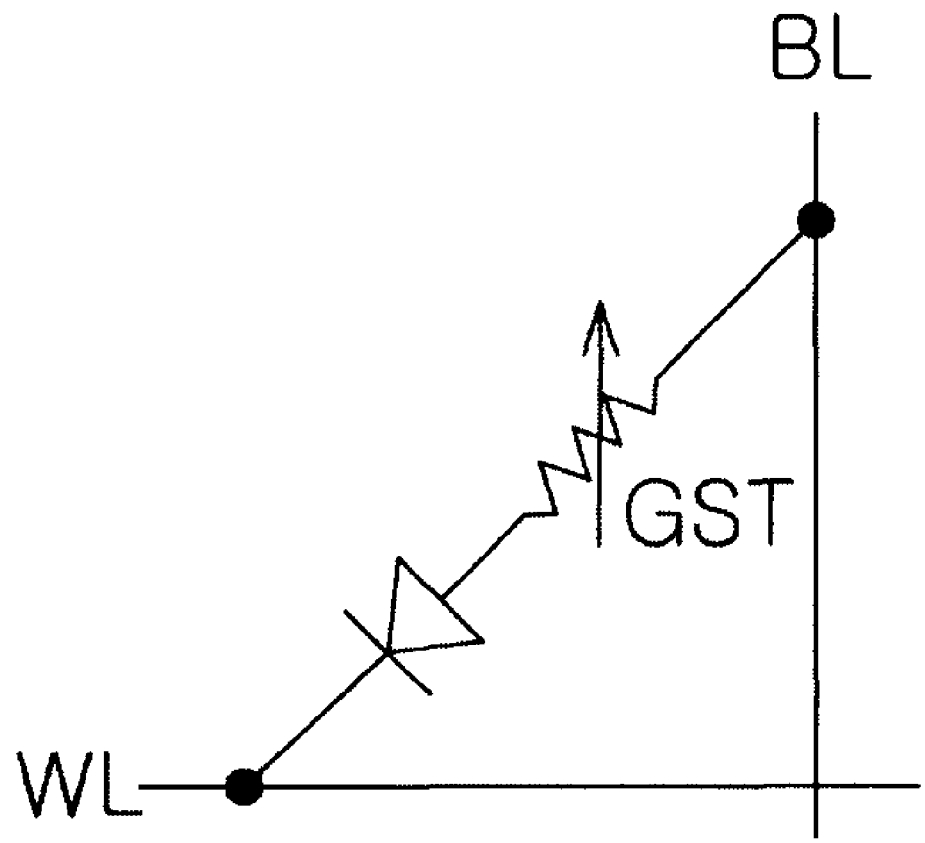
FIG. 1 is a circuit diagram illustrating a memory cell of a conventional phase change memory apparatus.
Figure 2:
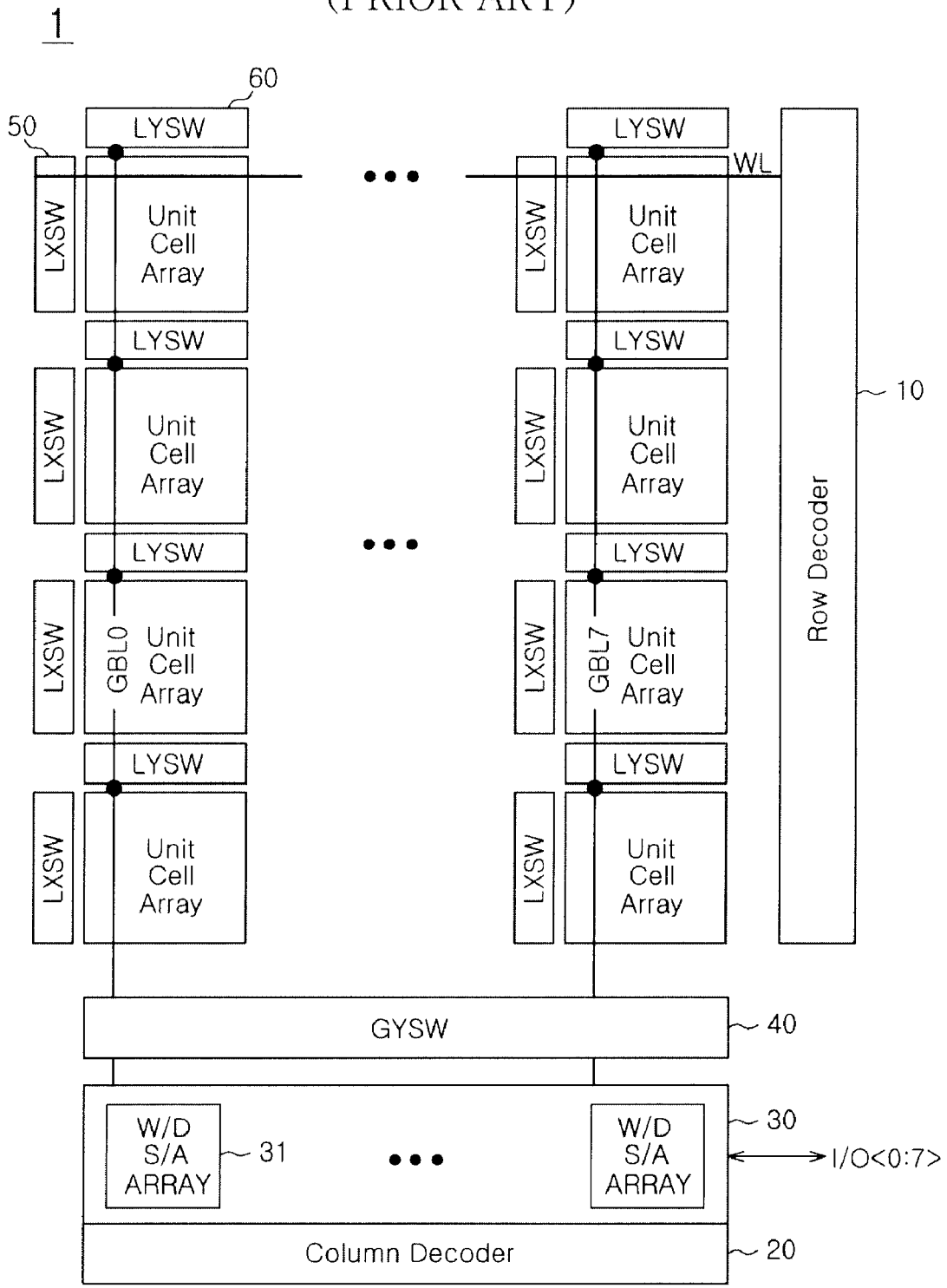
FIG. 2 is a block diagram illustrating a conventional X8 type phase change memory apparatus.
Figure 3:
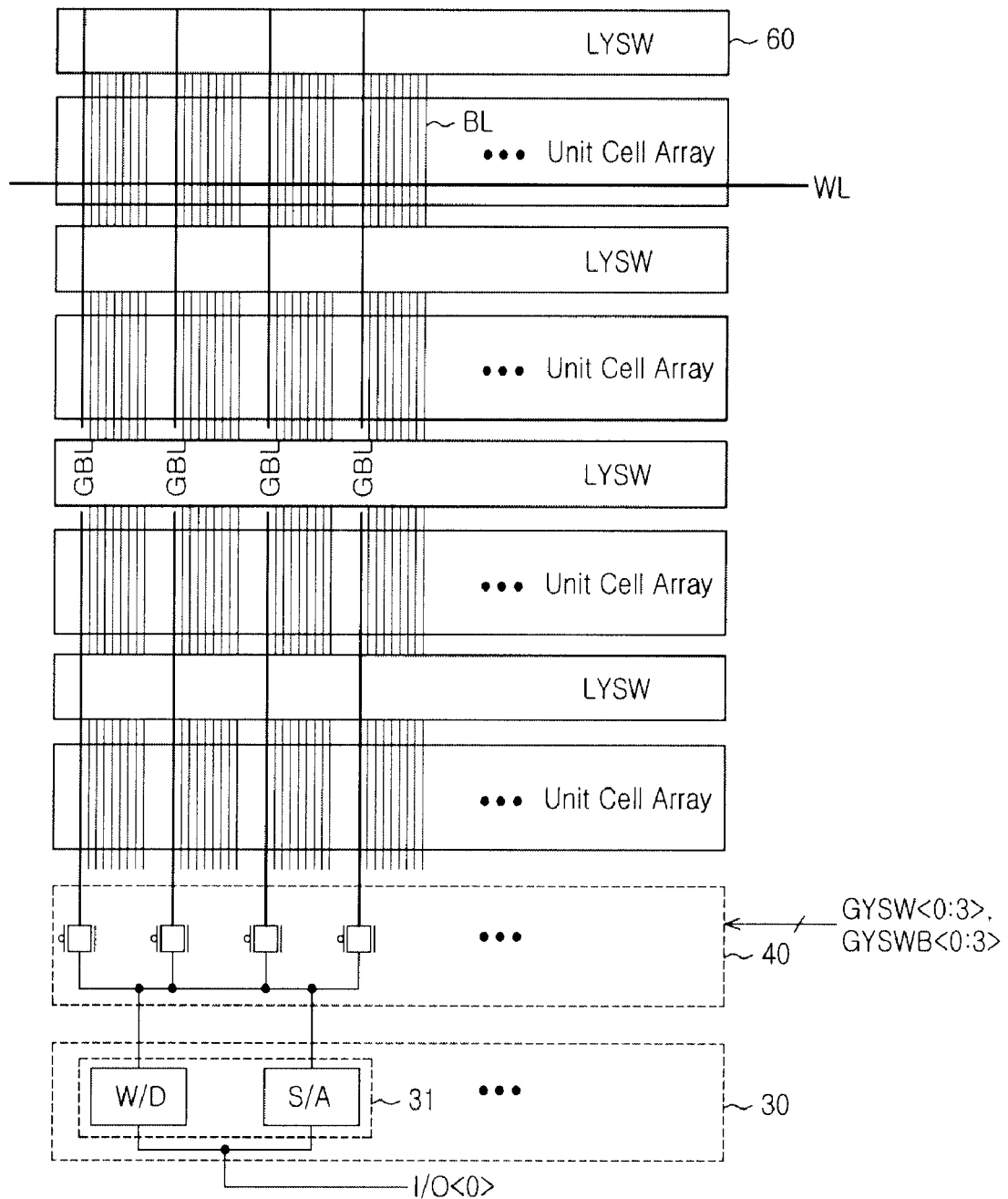
FIG. 3 is a circuit diagram illustrating component elements associated with an input/output path I/O<0> in the phase change memory apparatus shown in FIG. 2.
Figure 4:
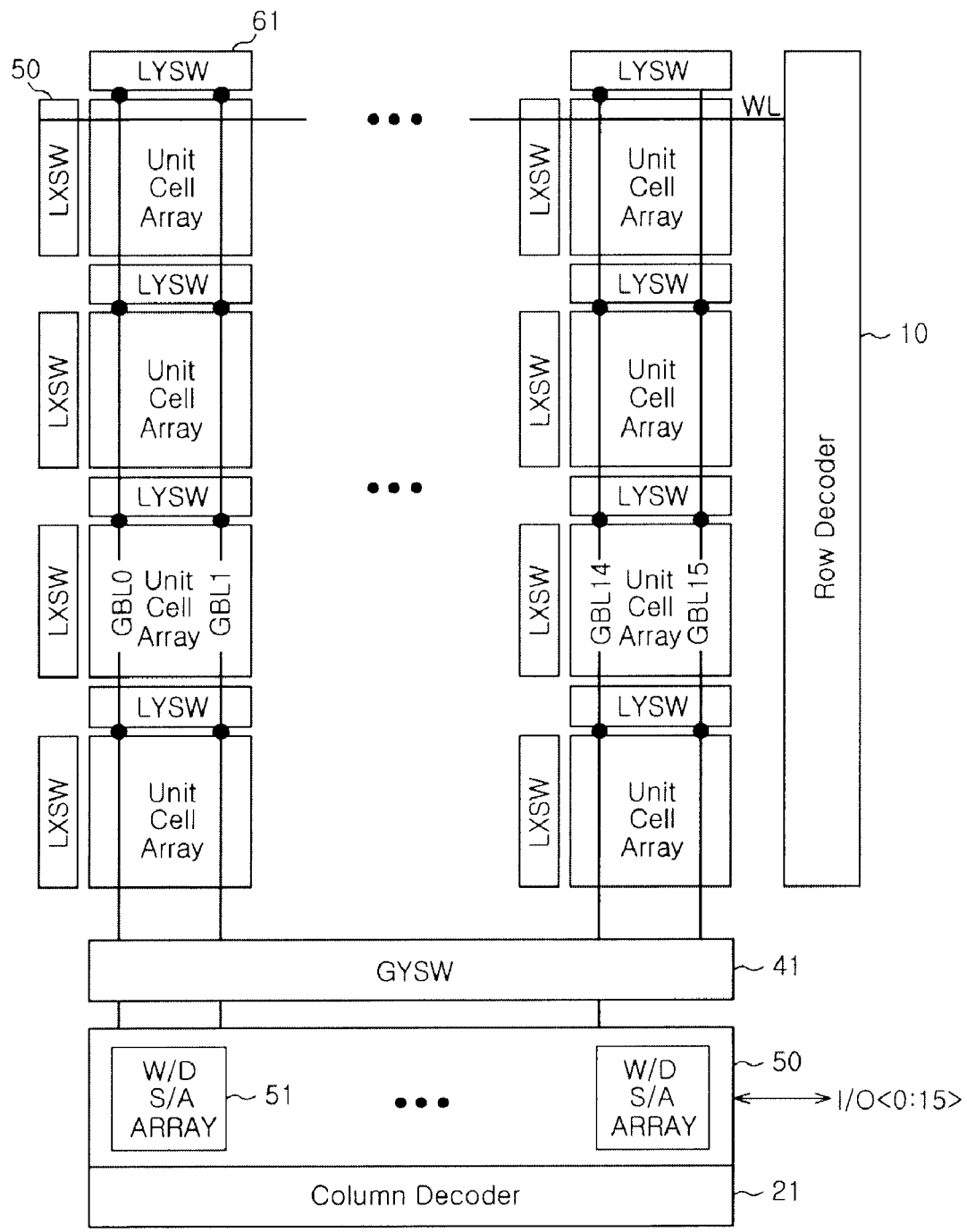
FIG. 4 is a block diagram illustrating a conventional X16 type phase change memory apparatus.
Figure 5:
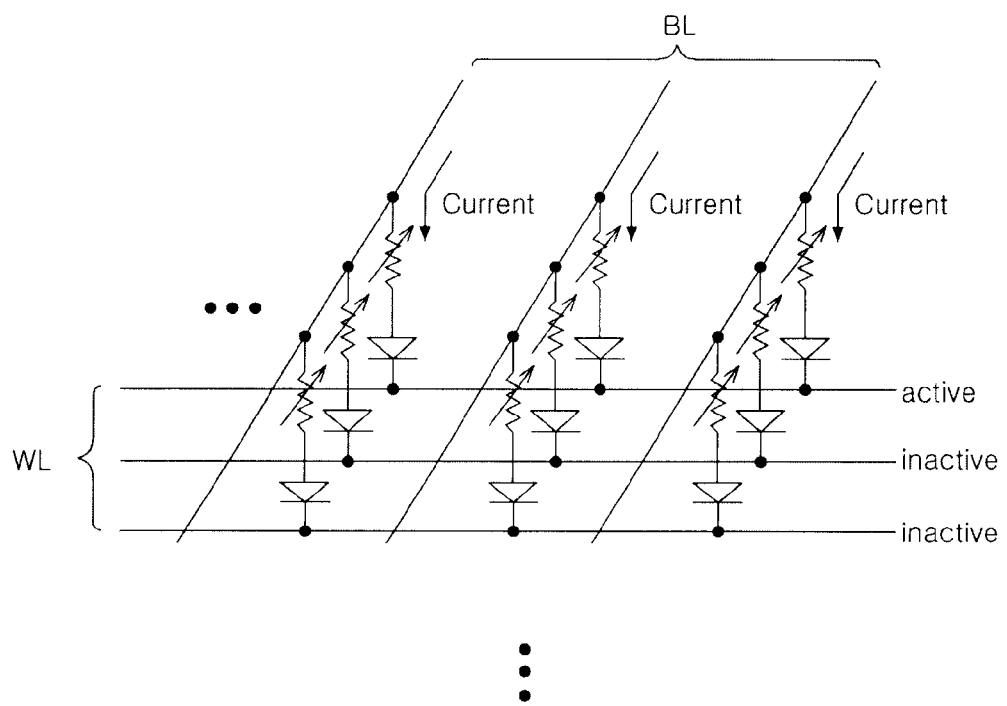
FIG. 5 is a circuit diagram illustrating a current supply state to memory cells in the phase change memory apparatus shown in FIG. 4.

Each of the plurality of unit cell arrays 'Unit Cell Array' includes a plurality of memory cells. The memory cell can be configured in such a manner that germanium-antimony-tellurium ($Ge_2Sb_2Te_5$: GST) as a phase change substance is connected with a diode as shown in FIG. 1.

In the plurality of unit cell arrays 'Unit Cell Array', word lines WL are disposed to extend in the row direction, and a plurality of global bit lines GBL<0:15, 0':15'> are disposed to extend in the column direction.

FIG. 6 illustrates only activated word lines WLi and WLj among the entire word lines WL. Also, while not shown in a drawing, a plurality of sub word lines SWL are connected with each of the word lines WL.

Hereinafter, the global bit lines GBL<0, 0', 2, 2',~14, 14'> will be referred to as the odd global bit lines, and the global bit lines GBL<1, 1', 3, 3',~15, 15'> will be referred to as even global bit lines.

The odd global bit lines GBL<0, 0', 2, 2',~14, 14'> and the even global bit lines GBL<1, 1', 3, 3', ~15, 15'> are disposed in such a way as not to be connected to the same unit cell arrays 'Unit Cell Array'.

The odd global bit lines GBL<0, 0', 2, 2',~14, 14'> are connected with odd-numbered unit cell arrays 'Unit Cell Array' (for example, the first unit cell array and the third unit cell array) in the column direction.

The even global bit lines GBL<1, 1', 3, 3',~15, 15'> are connected with even-numbered unit cell arrays 'Unit Cell Array' (for example, the second unit cell array and the fourth unit cell array) in the column direction.

The row decoder 110 is configured to activate a plural number of word lines, for example, two word lines WLi and WLj as shown in FIG. 6 in response to a row address which designates one word line. The row decoder 110 is configured to activate the word line WLi corresponding to the row address and the next-numbered word line WLj, that is, the word line WLj corresponding to the next row address.

The row decoder 110 is according to an X16 type. In the case of an X32 type, the row decoder 110 would be configured to activate four word lines including the word line corresponding to a row address. For example, the activated four word lines would be corresponding to the order of the four row addresses.

The column decoder 120 is configured to generate column control signals GYSW<0:1> and GYSWB<0:1> in response to a column address. Also, the column decoder 120 is configured to generate control signals for controlling the plurality of local column switch blocks 160 in response to the column address.

The write driver/sense amplifier array block 130 includes a plurality of write driver/sense amplifier arrays 131 which are connected with input/output paths I/O<0:15>.

The global column switch block 140 is configured to select one global bit line GBL among the odd global bit lines GBL<0, 0', 2, 2',~14, 14'> and one global bit line GBL among the even global bit lines GBL<1, 1', 3, 3',~15, 15'>, in response to the column control signals GYSW<0:1> and GYSWB<0:1>.

Each of the plurality of local row switch blocks 150 is configured to select one of the plurality of sub word lines SWL connected to each of the activated word lines WLi and WLj.

Each of the plurality of local column switch blocks 160 is configured to select one of the plurality of bit lines BL (see FIG. 7) connected to each of a plurality of global bit lines GBL<0:15'>, in response to the control signal provided from the column decoder 120.

Figure 7:
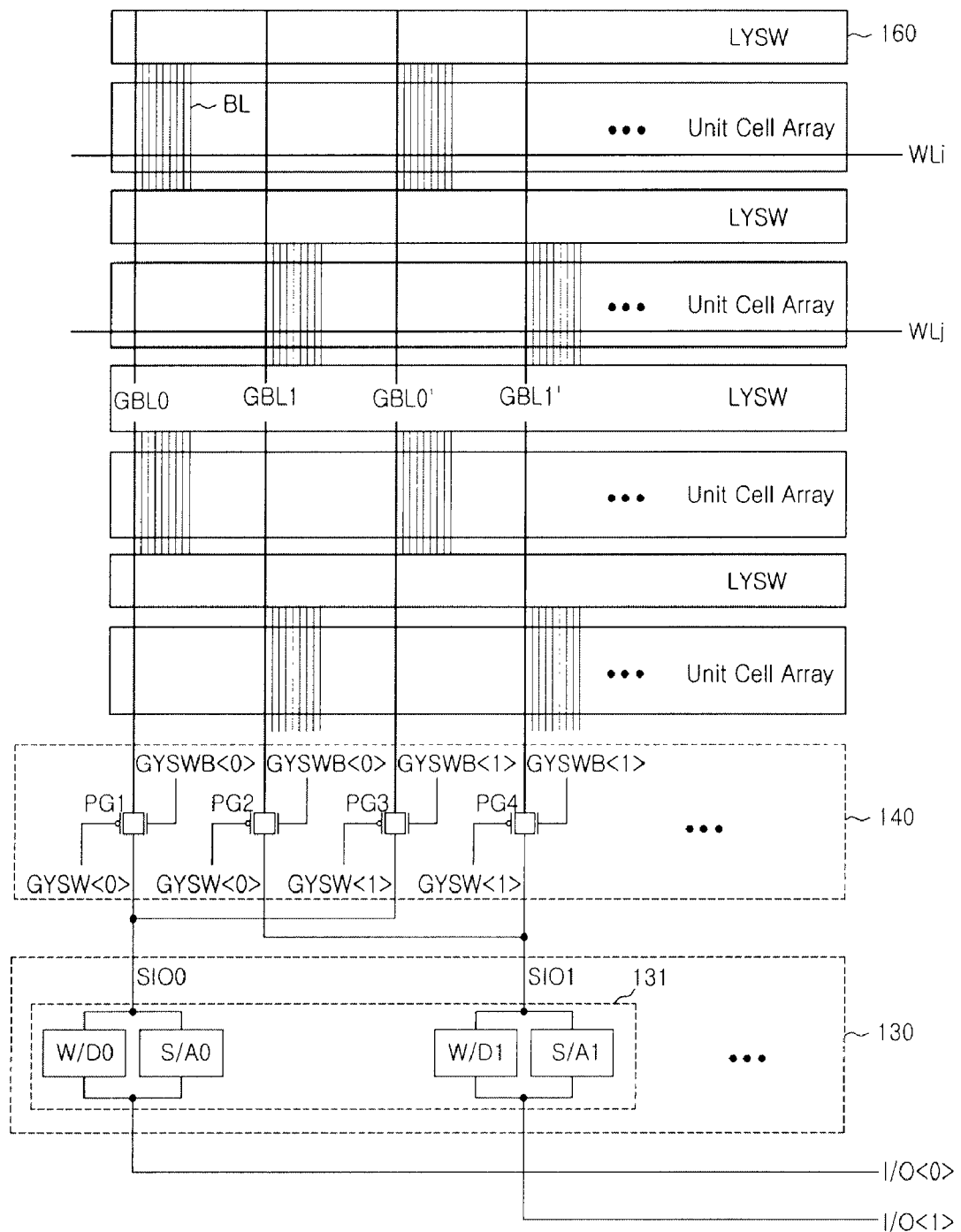
FIG. 7 is a circuit diagram illustrating component elements associated with input/output paths I/O<0:1> in the phase change memory apparatus shown in FIG. 6.

As shown in FIG. 7, the global column switch block 140 includes a plurality of switch groups. Each switch group has first through fourth pass gates PG1 through PG4.

One terminal of each of the first through fourth pass gates PG1 through PG4 is connected to each of the global bit lines GBL<0:1'> as shown in FIG. 7.

The other terminal of each of the first and third pass gates PG1 and PG3 is commonly connected to a first signal line SIO0, and the other terminal of each of the second and fourth pass gates PG2 and PG4 is commonly connected to a second signal line SIO1.

The first through fourth pass gates PG1 through PG4 are configured to select global bit lines GBL<0, 0'> or GBL<1, 1'> between the odd global bit lines GBL<0, 0'> and the even global bit lines GBL<1, 1'>, in response to the column control signals GYSW<0:1> and GYSWB<0:1>.

The write driver/sense amplifier array 131 has first and second write drivers W/D0 and W/D1 and first and second sense amplifiers S/A0 and S/A1.

The first write driver W/D0 and the first sense amplifier S/A0 are connected between the first signal line SIO0 and the first input/output path I/O<0>.

The second write driver W/D1 and the second sense amplifier S/A1 are connected between the second signal line SIO1 and the second input/output path I/O<1>.

Operations of the phase change memory apparatus 100 in accordance with an embodiment of the present invention, configured as mentioned above, will be described below.

An external address inputted in response to a read command is decoded, and a row address and a column address are generated.

The row decoder 110 activates the word line WLi corresponding to the row address and the adjacent word line WLj, that is, the word line corresponding to the next-numbered row address.

The unit cell arrays 'Unit Cell Array' connected with the two activated word lines WLi and WLj are selected.

The column decoder 120 generates the column control signals GYSW<0:1> and GYSWB<0:1> in response to the column address.

For example, it is assumed that the column control signals GYSW<0> and GYSWB<0> are activated and the column control signals GYSW<1> and GYSWB<1> are deactivated.

Referring to FIG. 7, since the first and second pass gates PG1 and PG2 are turned on as the column control signals GYSW<0> and GYSWB<0> are activated, the odd global bit line GBL<0> and the even global bit line GBL<1> are selected.

One data is applied to the first signal line SIO0 by way of the odd global bit line GBL<0> and the first pass gate PG1 from the odd-numbered unit cell array 'Unit Cell Array', that is, the unit cell array 'Unit Cell Array' connected with the word line WLi.

At the same time, one data is applied to the second signal line SIO2 by way of the even global bit line GBL<1> and the second pass gate PG2 from the even-numbered unit cell array 'Unit Cell Array', that is, the unit cell array 'Unit Cell Array' connected with the word line WLj.

The first sense amplifier S/A0 detects and amplifies the data applied to the first signal line SIO0 and outputs the detected and amplified data through the first input/output path I/O<0>.

At the same time, the second sense amplifier S/A1 detects and amplifies the data applied to the second signal line SIO1 and outputs the detected and amplified data through the second input/output path I/O<1>.

As a result, in an embodiment of the present invention according to the X16 type, the two word lines WLi and WLj are simultaneously activated in response to one read command, and one data are respectively outputted from two different unit cell arrays 'Unit Cell Array' through the first and second input/output paths I/O<0:1>. In this way, 16 data can be simultaneously outputted through all the input/output paths I/O<0:15>.

The write operation can be performed in a manner similar to the read operation except that the write drivers W/D0 and W/D1 operate in place of the sense amplifiers S/A0 and S/A1.

Figure 8:
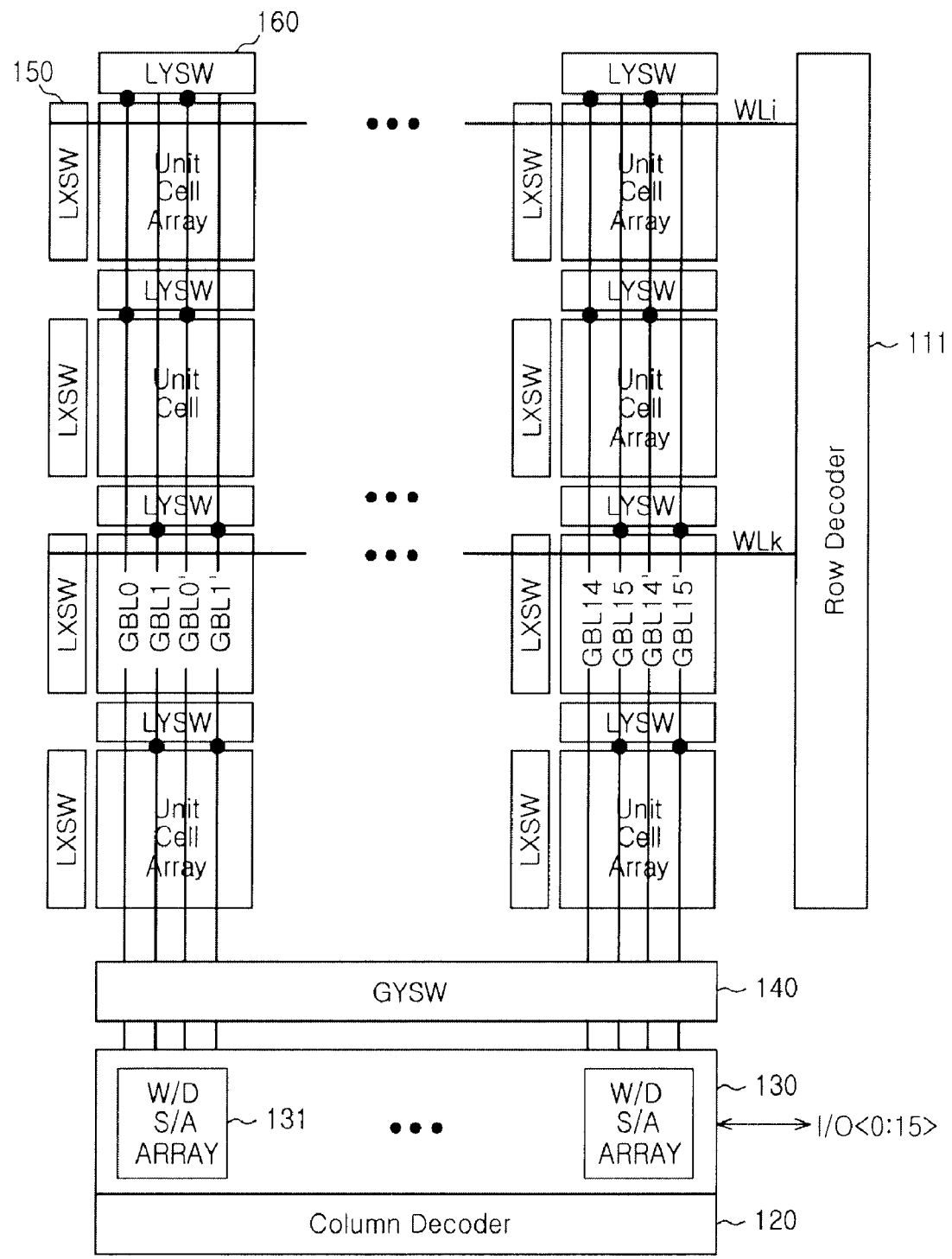
FIG. 8 is a block diagram illustrating a phase change memory apparatus in accordance with another embodiment of the present invention.

Referring to FIG. 8, a phase change memory apparatus 101 in accordance with another embodiment of the present invention includes a plurality of unit cell arrays 'Unit Cell Array', a row decoder 111, a column decoder 120, a write driver/ sense amplifier array block 130, a global column switch block 140, a plurality of local row switch blocks 150, and a plurality of local column switch blocks 160.

The other component elements except the connections between a plurality of global bit lines GBL<0:15'> and the plurality unit cell arrays 'Unit Cell Array' and the row decoder 111, that is, the column decoder 120, the write driver/sense amplifier array block 130, the global column switch block 140, the plurality of local row switch blocks 150, and the plurality of local column switch blocks 160 can be configured in the same manner as those of an embodiment shown in FIG. 6.

In the plurality of unit cell arrays 'Unit Cell Array', word lines WL are disposed to extend in the row direction, and the plurality of global bit lines GBL<0:15'> are disposed to extend in the column direction.

FIG. 8 illustrates only activated word lines WLi and WLk among entire word lines WL. Also, while not shown in a drawing, a plurality of sub word lines SWL are connected with each of the word lines WL.

Hereinafter, the global bit lines GBL<0, 0', 2, 2',~14, 14'> will be referred to as the odd global bit lines, and the global bit lines GBL<1, 1', 3, 3',~15, 15'> will be referred to as the even global bit lines.

The odd global bit lines GBL<0, 0', 2, 2',~14, 14'> and the even global bit lines GBL<1, 1', 3, 3',~15, 15'> are disposed in such a way as to be connected with alternate two unit cell arrays 'Unit Cell Array'. The odd global bit lines GBL<0, 0', 2, 2',~14, 14'> and the even global bit lines GBL<1, 1', 3, 3',~15, 15'> are disposed in such a way as not to be connected with the same unit cell arrays 'Unit Cell Array'.

The odd global bit lines GBL<0, 0', 2, 2',~14, 14'> are connected to two adjoining unit cell arrays 'Unit Cell Array' (for example, the first unit cell array and the second unit cell array) which are adjacent in the column direction.

The even global bit lines GBL<1, 1', 3, 3',~15, 15'> are connected to two adjoining unit cell arrays 'Unit Cell Array' (the third unit cell array and the fourth unit cell array) which come next to the two adjoining unit cell arrays 'Unit Cell Array' connected with the odd global bit lines GBL<0, 0', 2, 2',~14, 14'> in the column direction.

The row decoder 111 is configured to activate one word line in every two word lines. The row decoder 111 is configured to activate a plural number of word lines, that is, the two word lines WLi and WLk in response to a row address which designates one word line. The row decoder 111 is configured to activate the word line WLi corresponding to the row address and the word line WLk which comes by skipping a word line next to the word line WLi.

The row decoder 111 is according to an X16 type. In the case of an X32 type, a row decoder 111 is configured in such a way as to activate one word line in every two word lines, that is, a total four word lines.

Operations of the phase change memory apparatus 101 in accordance with an embodiment of the present invention, configured as mentioned above, will be described below.

An external address is inputted in response to a read command is decoded, and a row address and a column address are generated.

The row decoder 111 activates the word line WLi corresponding to the row address and another word line WLk.

The unit cell arrays 'Unit Cell Array' connected to the two activated word lines WLi and WLk are selected.

The column decoder 120 generates column control signals GYSW<0:1> and GYSWB<0:1> in response to the column address.

For example, it is assumed that the column control signals GYSW<0> and GYSWB<0> are activated and the column control signals GYSW<1> and GYSWB<1> are deactivated.

Figure 9:
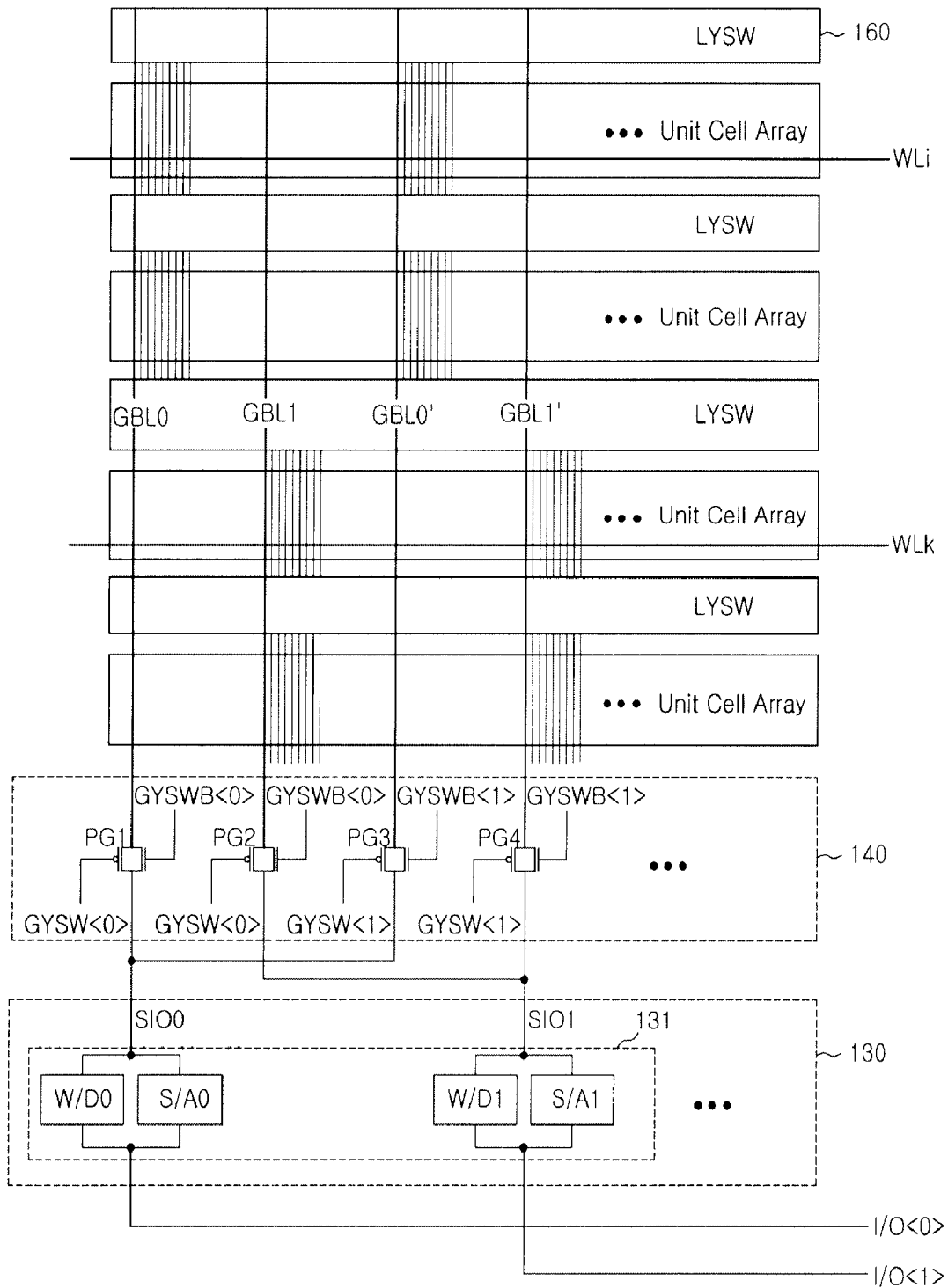
FIG. 9 is a circuit diagram illustrating component elements associated with input/output paths I/O<0:1> in the phase change memory apparatus shown in FIG. 8.

Referring to FIG. 9, since first and second pass gates PG1 and PG2 are turned on as the column control signals GYSW<0> and GYSWB<0> are activated, the odd global bit line GBL<0> and the even global bit line GBL<1> are selected.

One data is applied to a first signal line SIO0 by way of the odd global bit line GBL<0> and the first pass gate PG1 from the unit cell array 'Unit Cell Array' connected with the word line WLi.

One data is applied to a second signal line SIO2 by way of the even global bit line GBL<1> and the second pass gate PG2 from the unit cell array 'Unit Cell Array' connected with the word line WLk.

The first sense amplifier S/A0 detects and amplifies the data applied to the first signal line SIO0 and outputs the detected and amplified data through a first input/output path I/O<0>.

The second sense amplifier S/A1 detects and amplifies the data applied to the second signal line SIO1 and outputs the detected and amplified data through a second input/output path I/O<1>.

As a result, in an embodiment of the present invention according to the X16 type, the two word lines WLi and WLk are simultaneously activated in response to one read command, and one data are respectively outputted from two different unit cell arrays through the first and second input/output paths I/O<0:1>. In this way, 16 data can be simultaneously outputted through all input/output paths I/O<0:15>.

The write operation can be performed in a manner similar to the read operation except that write drivers W/D0 and W/D1 operate in place of the sense amplifiers S/A0 and S/A1.

The above-described embodiments of the present invention are according to the X16 type. The present invention can be applied to an X32 type, an X64 type, etc. through changing the design of the circuit adopting the technical concept of the present invention as clearly described above through embodiments in a manner such that the number of word lines to be simultaneously activated is increased.

As is apparent from the above description, in the phase change memory apparatus in accordance with the embodiments of the present invention, since the number of memory cells selected by one word line does not increase even when the number of input/output lines (I/O) increases, stable data recording is possible, and the reliability of cell data can be improved.

While certain embodiments have been described above, it will be understood to those skilled in the art that the embodiments described are by way of example only. Accordingly, the phase change memory apparatus described herein should not be limited based on the described embodiments. Rather, the phase change memory apparatus described herein should only be limited in light of the claims that follow when taken in conjunction with the above description and accompanying drawings.

What is claimed is:

1. A semiconductor memory apparatus comprising:
a plurality of unit cell arrays, wherein word lines are disposed in a row direction and a plurality of global bit lines are disposed in a column direction;
a row decoder configured to activate at least two word lines in response to a row address which designates one word line;
a global column switch block configured to select two different global bit lines in response to column control signals;
a column decoder configured to generate the column control signals in response to a column address; and
write drivers and sense amplifiers respectively connected between the selected two global bit lines and different input/output paths.

2. The semiconductor memory apparatus according to claim 1, wherein the unit cell array includes phase change memory cells each comprising a phase change substance connected with a bit line, and a memory cell including diode connected between the phase change substance and a word line.

3. The semiconductor memory apparatus according to claim 1, wherein the plurality of global bit lines comprises odd global bit lines and even global bit lines that are disposed such that no single unit cell array is connected with both even and odd global bit lines.

4. The semiconductor memory apparatus according to claim 3, wherein the global column switch block is configured to select one of the odd global bit lines and one of the even global bit lines.

5. The semiconductor memory apparatus according to claim 3, wherein the plurality of global bit lines comprise:
odd global bit lines connected to odd-numbered unit cell arrays among the plurality of unit cell arrays; and
even global bit lines connected to even-numbered unit cell arrays among the plurality of unit cell arrays.

6. The semiconductor memory apparatus according to claim 3, wherein the plurality of global bit lines include odd global bit lines and even global bit lines are disposed in such a way as be connected to alternate two different unit cell arrays among the plurality of unit cell arrays.

7. The semiconductor memory apparatus according to claim 1, wherein the row decoder is configured to activate the word line corresponding to the row address and a word line corresponding to a next row address.

8. The semiconductor memory apparatus according to claim 1, wherein the row decoder is configured to activate one word line in every two word lines including the word line corresponding to the row address.

9. A semiconductor memory apparatus comprising:
a plurality of unit cell arrays each having a memory cell;
a plurality of word lines disposed in a row direction of the plurality of unit cell arrays in a row direction;

odd global bit lines connected to odd-numbered unit cell arrays among the plurality of unit cell arrays in a column direction;
even global bit lines connected to even-numbered unit cell arrays among the plurality of unit cell arrays in the column direction;
a row decoder configured to activate, in response to a row address designating one word line, the word line corresponding to the row address and a word line corresponding to a next row address;
a global column switch block configured to select one of the even global bit lines and one of the odd global bit lines in response to column control signals; and
a column decoder configured to generate the column control signals in response to a column address.

10. The semiconductor memory apparatus according to claim 9, wherein the memory cell is a phase change memory cell having a GST (germanium-antimony-tellurium) connected with a bit line and a diode connected between the GST and a word line.

11. The semiconductor memory apparatus according to claim 10, wherein the bit line is connected to the even global bit line or the odd global bit line.

12. The semiconductor memory apparatus according to claim 9, further comprising:
a first write driver and a first sense amplifier commonly connected between global bit lines, selected one by each among the even global bit lines and among the odd global bit lines, and a first input/output path; and
a second write driver and a second sense amplifier commonly connected between other global bit lines, selected one by each among the even global bit lines and among the odd global bit lines, and a second input/output path.

13. A semiconductor memory apparatus comprising:
a plurality of unit cell arrays each having a memory cell;
a plurality of word lines disposed in a row direction of the plurality of unit cell arrays in a row direction;
odd global bit lines and even global bit lines respectively disposed to be connected to alternate two unit cell arrays in a column direction among the plurality of unit cell arrays;
a row decoder configured to activate, in response to a row address designating a word line, one word line in every two word lines including the word line corresponding to the row address;
a global column switch block configured to select one of the odd global bit lines and one of the even global bit lines in response to column control signals; and
a column decoder configured to generate the column control signals in response to a column address,
wherein the odd global bit lines and the even global bit lines are disposed in such a way no unit cell array is connected to both even and odd global bit lines.

14. The semiconductor memory apparatus according to claim 13, wherein the memory cell includes a phase change substance connected to a bit line and a diode connected between the phase change substance and a word line.

15. The semiconductor memory apparatus according to claim 14, wherein the bit line is connected to the odd global bit line or the even global bit line.

16. The semiconductor memory apparatus according to claim 13, further comprising:
a first write driver and a first sense amplifier commonly connected between global bit lines, selected one by each among the odd global bit lines and among the even global bit lines, and a first input/output path; and
a second write driver and a second sense amplifier commonly connected between other global bit lines, selected one by each among the odd global bit lines and among the even global bit lines, and a second input/output path.

* * * * *